(12) United States Patent
Hsieh et al.

(10) Patent No.: US 11,214,872 B2
(45) Date of Patent: Jan. 4, 2022

(54) CYCLICAL EPITAXIAL DEPOSITION SYSTEM AND GAS DISTRIBUTION MODULE THEREOF

(71) Applicant: GOLD CARBON CO., LTD., Taoyuan (TW)

(72) Inventors: Chien-Te Hsieh, Taoyuan (TW); Yeou-Fu Lin, Taoyuan (TW); Chia-Hung Chao, Taoyuan (TW)

(73) Assignee: GOLD CARBON CO., LTD., Taoyuan (TW)

( * ) Notice: Subject to any disclaimer, the term of this patent is extended or adjusted under 35 U.S.C. 154(b) by 0 days.

(21) Appl. No.: 16/886,940

(22) Filed: May 29, 2020

(65) Prior Publication Data
US 2020/0385869 A1    Dec. 10, 2020

(30) Foreign Application Priority Data
Jun. 4, 2019    (TW) ................................ 108119274

(51) Int. Cl.
*C23C 16/50*    (2006.01)
*C23C 16/54*    (2006.01)
*C23C 16/455*    (2006.01)

(52) U.S. Cl.
CPC ........ *C23C 16/54* (2013.01); *C23C 16/45544* (2013.01); *C23C 16/45559* (2013.01); *C23C 16/45578* (2013.01)

(58) Field of Classification Search
CPC .............. C23C 16/54; C23C 16/45544; C23C 16/45559; C23C 16/45578; C23C 16/45551; C23C 16/0245; C23C 16/45565; C23C 16/545

USPC ................. 118/718, 719; 156/345.2, 345.22
See application file for complete search history.

(56) References Cited

U.S. PATENT DOCUMENTS

| 8,512,509 B2* | 8/2013 | Bera ..................... H01J 37/321 156/345.34 |
| 2003/0194493 A1 | 10/2003 | Chang et al. |
| 2008/0305246 A1* | 12/2008 | Choi ................. C23C 16/45565 427/74 |
| 2011/0159186 A1 | 6/2011 | Chakchung Yu et al. |

* cited by examiner

*Primary Examiner* — Rudy Zervigon
(74) *Attorney, Agent, or Firm* — Li & Cai Intellectual Property (USA) Office

(57) ABSTRACT

A cyclical epitaxial deposition system and a gas distribution module are provided. The gas distribution module includes an inflow element having a plurality of inlet holes, a guide assembly, and an outflow element. The guide assembly disposed between the inflow and outflow elements includes a plurality of guide channels separate from one another and a plurality of temporary gas retention trenches respectively corresponding to the guide channels. Each of the guide channels is in fluid communication with the corresponding inlet hole. The outflow element has a plurality of diffusion regions respectively corresponding to the gas retention trenches, and a plurality of outlet channels respectively corresponding to the diffusion regions. Each of the diffusion regions has a plurality of diffusion apertures, and each of the temporary gas retention trenches is in fluid communication with the corresponding outlet channel through the diffusion apertures in the corresponding diffusion region.

13 Claims, 6 Drawing Sheets

CYCLICAL EPITAXIAL DEPOSITION SYSTEM AND GAS DISTRIBUTION MODULE THEREOF

CROSS-REFERENCE TO RELATED PATENT APPLICATION

This application claims the benefit of priority to Taiwan Patent Application No. 108119274, filed on Jun. 4, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an epitaxial deposition system and a gas distribution module thereof, and more particularly to a cyclical epitaxial deposition system using a principle of atomic layer deposition and a gas distribution module thereof.

BACKGROUND OF THE DISCLOSURE

Atomic layer deposition (ALD) is a vapor phase technique used to grow high-quality thin films. Compared with a film layer formed by means of chemical vapor deposition or physical vapor deposition, a film layer formed by the atomic layer deposition has relatively high density, thickness uniformity, and step coverage. In addition, the thickness of the film layer can be precisely controlled by use of atomic layer deposition. Therefore, the atomic layer deposition technique has been applied in manufacturing of electronic elements.

During atomic layer deposition, in each deposition cycle, two different precursor gases are sequentially introduced into a deposition chamber at different time points, instead of at the same time. The precursor gas introduced each time reacts with the surface of a substrate in a self-limiting manner to form a monoatomic layer. A film layer having a particular thickness can be formed only after multiple deposition cycles.

Therefore, a fabrication process using atomic layer deposition takes a relatively long time as compared with chemical vapor deposition, and currently cannot be applied in continuous production, thus being inapplicable in manufacturing of elements or devices requiring mass production.

SUMMARY OF THE DISCLOSURE

A technical problem to be solved by the present disclosure lies in providing a cyclical epitaxial deposition system and a gas distribution module, so as to shorten deposition time in the use of an atomic layer deposition technique.

In one aspect, the present disclosure provides a gas distribution module. The gas distribution module includes an inflow element, a guide assembly, and an outflow element. The inflow element includes a plurality of inlet holes individually arranged thereon. The guide assembly includes a plurality of guide channels that are not in spatial communication from one another and a plurality of temporary gas retention trenches respectively corresponding to the guide channels. Each of the guide channels includes a main channel and a plurality of distribution channels connected to the main channel. The main channel is in fluid communication with the corresponding inlet hole, and each distribution channel is in fluid communication with the corresponding temporary gas retention trench. The guide assembly is disposed between the inflow element and the outflow element. The outflow element has a plurality of diffusion regions respectively corresponding to the temporary gas retention trenches, and a plurality of outlet channels respectively corresponding to the diffusion regions. Each of the diffusion regions has a plurality of diffusion apertures scatteringly arranged thereon, and each of the temporary gas retention trenches is in fluid communication with the corresponding outlet channel through the diffusion apertures in the corresponding diffusion region, so that a gas which flows along the guide channels to the temporary gas retention trenches is dispersed and guided to a region to be processed on a substrate.

In another aspect, the present disclosure provides a cyclical epitaxial deposition system, which includes: a deposition chamber, a conveyance device, and a gas distribution module. The conveyance device is used to continuously convey a substrate into or out of the deposition chamber along a conveyance path; and the gas distribution module is disposed in the deposition chamber and located above the conveyance path, so as to separately guide at least one precursor gas and at least one purge gas to the substrate.

The present disclosure achieves the following advantageous effects. In the cyclical epitaxial deposition system and the gas distribution module thereof provided by the present disclosure, a guide assembly includes a plurality of guide channels not in spatial communication with one another and a plurality of temporary gas retention trenches respectively corresponding to the guide channels, an outflow element has a plurality of diffusion regions respectively corresponding to the temporary gas retention trenches and a plurality of outlet channels respectively corresponding to the diffusion regions, so that a gas flowing along the guide channels to the temporary gas retention trenches is dispersed and guided to a region to be processed on a substrate. In this way, when the gas distribution module is applied in the cyclical epitaxial deposition system, at least one precursor gas and at least one purge gas can be guided to different regions on the substrate at the same time, and a film layer can be continuously formed on the substrate, thus shortening deposition time and being applicable to manufacturing elements or devices requiring mass production.

To further understand the features and technical content of the present disclosure, reference is made to the following detailed description and drawings related to the present disclosure. However, the provided drawings are merely used for reference and description, and not intended to limit the present disclosure.

DETAILED DESCRIPTION OF THE EXEMPLARY EMBODIMENTS

Figure 1:
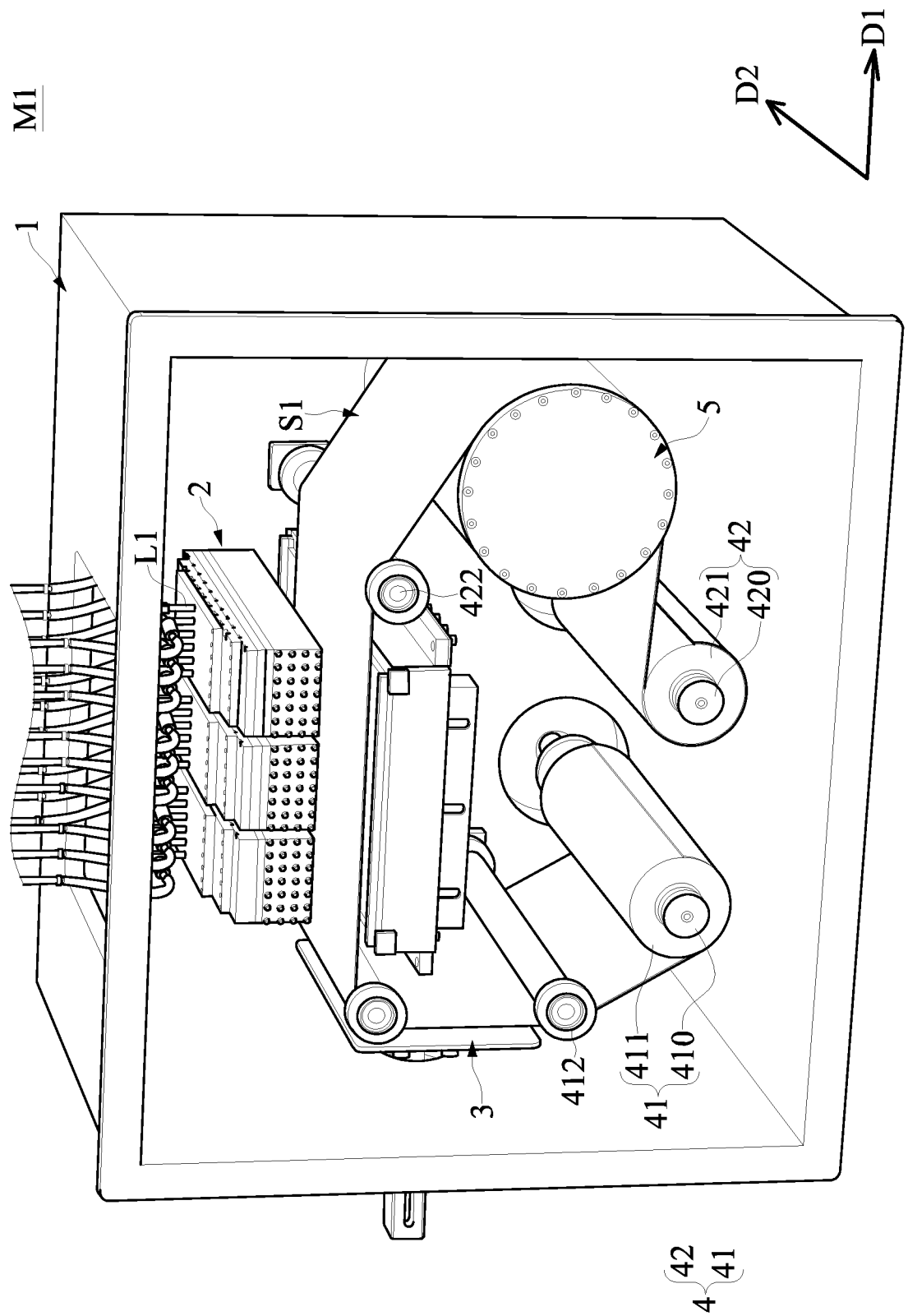
FIG. 1 is a schematic perspective view of a cyclical epitaxial deposition system in an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following describes an implementation manner of the present disclosure relating to "a cyclical epitaxial deposition system and a gas distribution module thereof" through specific embodiments. Those skilled in the art can easily understand the advantages and effects of the present disclosure from the content disclosed in the specification. The present disclosure can be embodied or applied through other different embodiments. Based on different opinions and applications, the details in the present specification can also be modified and changed without departing from the concept of the present disclosure. In addition, it should be stated first that the accompanying drawings of the present disclosure are merely for brief illustration and not drawn according to actual dimensions. The following embodiments will further explain the related technical content of the present disclosure, but the disclosed content is not intended to limit the scope of protection of the present disclosure.

It should be understood that, although the terms "first", "second", "third", and the like are probably used herein to describe various elements, these elements should not be limited by these terms. The use of these terms only aims to distinguish one element from another. In addition, the term "or" as used herein shall, according to the actual situation, include any one or a combination of more of the associated listed items.

Reference is made to FIG. 1, which is a schematic perspective view of a cyclical epitaxial deposition system in an embodiment of the present disclosure. It should be noted that, the cyclical epitaxial deposition system M1 in the embodiment of the present disclosure is used to form a particular film layer, such as a platinum layer, aluminum oxide layer, nickel oxide layer, tin oxide layer, titanium oxide layer, iron oxide layer, zinc oxide layer, lithium phosphorus oxynitride (LiPON) layer, or titanium nitride layer, on a substrate S1 according to a principle of atomic layer deposition (or atomic layer epitaxy). In addition, the cyclical epitaxial deposition system M1 in the embodiment of the present disclosure is applicable to a roll-to-roll continuous process.

As shown in FIG. 1, the cyclical epitaxial deposition system M1 at least includes a deposition chamber 1, a gas distribution module 2, a pre-processing module 3, and at least one conveyance device 4.

In this embodiment, the deposition chamber 1 may be divided into a pre-processing zone and a deposition zone separate from each other, so as to prevent mutual diffusion of a gas introduced to the pre-processing zone and a gas introduced to the deposition zone. In an embodiment, the pre-processing zone and the deposition zone may be isolated from each other by a partition plate (not shown in FIG. 1). In another embodiment, the pre-processing module 3 and the gas distribution module 2 may be disposed in different sub-chambers, respectively, to be separated from each other. The pre-processing module 3 is disposed in the pre-processing zone, while the gas distribution module 2 is disposed in the deposition zone.

The conveyance device 4 is used to continuously convey a substrate S1 along a conveyance path through the pre-processing zone and the deposition zone. Specifically speaking, the pre-processing zone and the deposition zone are located at the conveyance path of the substrate S1. By continuous conveyance of the substrate S1 with the conveyance device 4, different regions of the substrate S1, namely, a region of the substrate S1 in the pre-processing zone and another region in the deposition zone, can be simultaneously subjected to pre-processing and film deposition.

The conveyance device 4 includes a first feeding and receiving module 41 and a second feeding and receiving module 42 which define the conveyance path of the substrate S1. Specifically, the substrate S1 is driven by the first feeding and receiving module 41 to be continuously conveyed to the pre-processing zone and the deposition zone. After being processed, the substrate S1 conveyed out of the deposition zone is rolled up by the second feeding and receiving module 42.

In this embodiment, the first feeding and receiving module 41 may include a first feeding and receiving reel 411 and a first drive element 410 connected to the axis of the first feeding and receiving reel 411. Likewise, the second feeding and receiving module 42 may include a second feeding and receiving reel 421 and a second drive element 420 connected to the axis of the second feeding and receiving reel 421.

The first drive element 410 and the second drive element 420 receive an instruction from a control module (not shown in the figure) to simultaneously drive the first feeding and receiving reel 411 and the second feeding and receiving reel 421 to rotate (clockwise), so that the substrate S1 wound on the first feeding and receiving reel 411 is continuously conveyed to the pre-processing zone and the deposition zone.

In addition, the first feeding and receiving module 41 may optionally include a first guide roller 412 used to change a conveyance direction of the substrate S1. Likewise, the second feeding and receiving module 42 may optionally include a second guide roller 422 used to change an advancing direction of the substrate S1 conveyed out of the deposition zone.

It should be noted that, in this embodiment, the first feeding and receiving module 41 and the second feeding and receiving module 42 may also change a moving direction of the substrate S1. Specifically, the first drive element 410 and the second drive element 420 receive an instruction from the control module to drive the first feeding and receiving reel 411 and the second feeding and receiving reel 421 to rotate in an opposite direction (counterclockwise), so that the substrate S1 can reciprocate in the deposition zone. In this way, a deposition cycle can be repeated for many times in the deposition zone, to form multiple molecular layers on the substrate S1.

However, the conveyance device 4 in the embodiment of the present disclosure is not limited thereto. In another embodiment, the conveyance device 4 includes a conveyance belt which can continuously convey a work piece to be deposited into or out of the pre-processing zone and the deposition zone.

Referring to FIG. 1, in the cyclical epitaxial deposition system M1 in the embodiment of the present disclosure, the substrate S1 enters the pre-processing zone before entering the deposition zone, to be subjected to a surface treatment.

The cyclical epitaxial deposition system M1 includes a pre-processing module 3 in the pre-processing zone, and the pre-processing module 3 is a plasma device. In an embodiment, oxygen, nitrogen, or argon may be introduced into the pre-processing zone to generate oxygen plasma, nitrogen plasma, or argon plasma. In this way, when the substrate S1 is continuously conveyed to the pre-processing zone, a surface treatment may be performed on the surface of the substrate S1 by using the plasma generated by the pre-processing module 3. The surface treatment is, for example, cleaning the surface of the substrate S1 or increasing functional groups in quantity on the surface of substrate S1. It should be noted that, the pre-processing zone and the pre-processing module 3 are optional elements, and may be omitted in other embodiments.

Driven by the conveyance device 4, the substrate S1 that has been subjected to the surface treatment may move from the pre-processing zone to the deposition zone, for film deposition.

Referring to FIG. 1, at least one gas distribution module 2 (FIG. 1 shows an example in which there are three gas distribution modules) is disposed in the deposition zone and located above the conveyance path. The gas distribution module 2 can be used to guide at least one precursor gas and at least one purge gas to different regions of the substrate S1.

Figure 2:
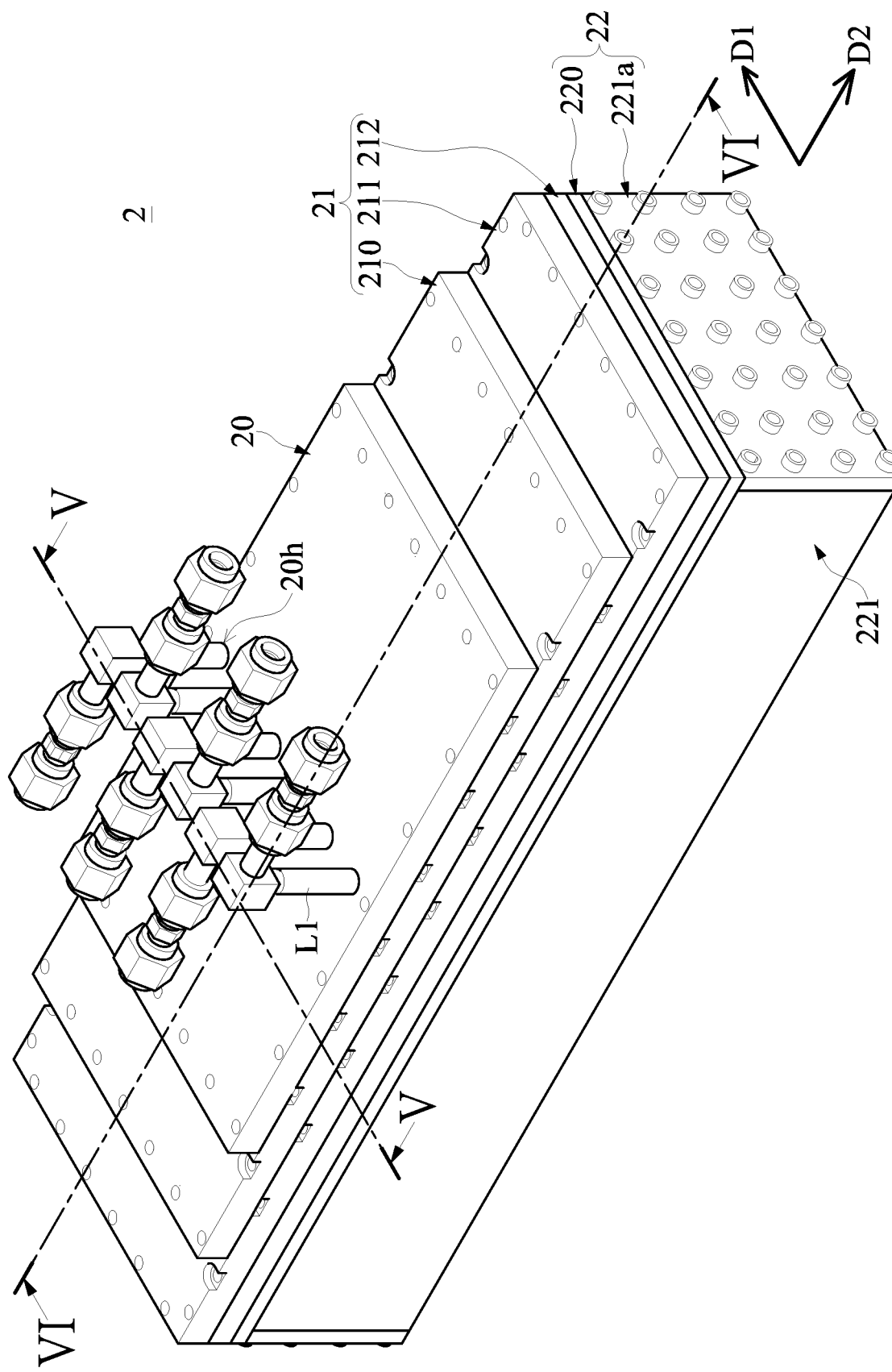
FIG. 2 is a schematic perspective view of a gas distribution module in an embodiment of the present disclosure.
Figure 3:
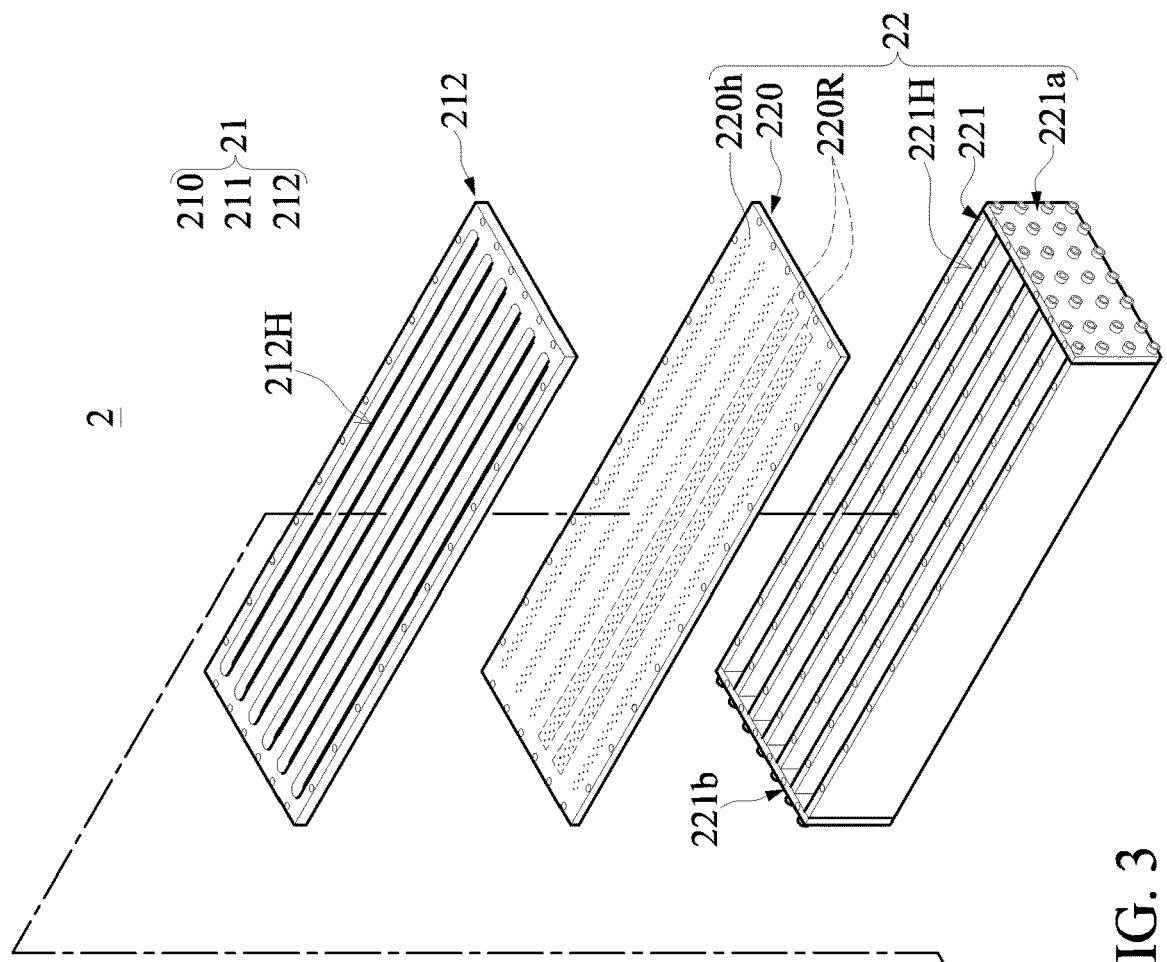
FIG. 3 is a three-dimensional exploded view of the gas distribution module in FIG. 2.
Figure 3:
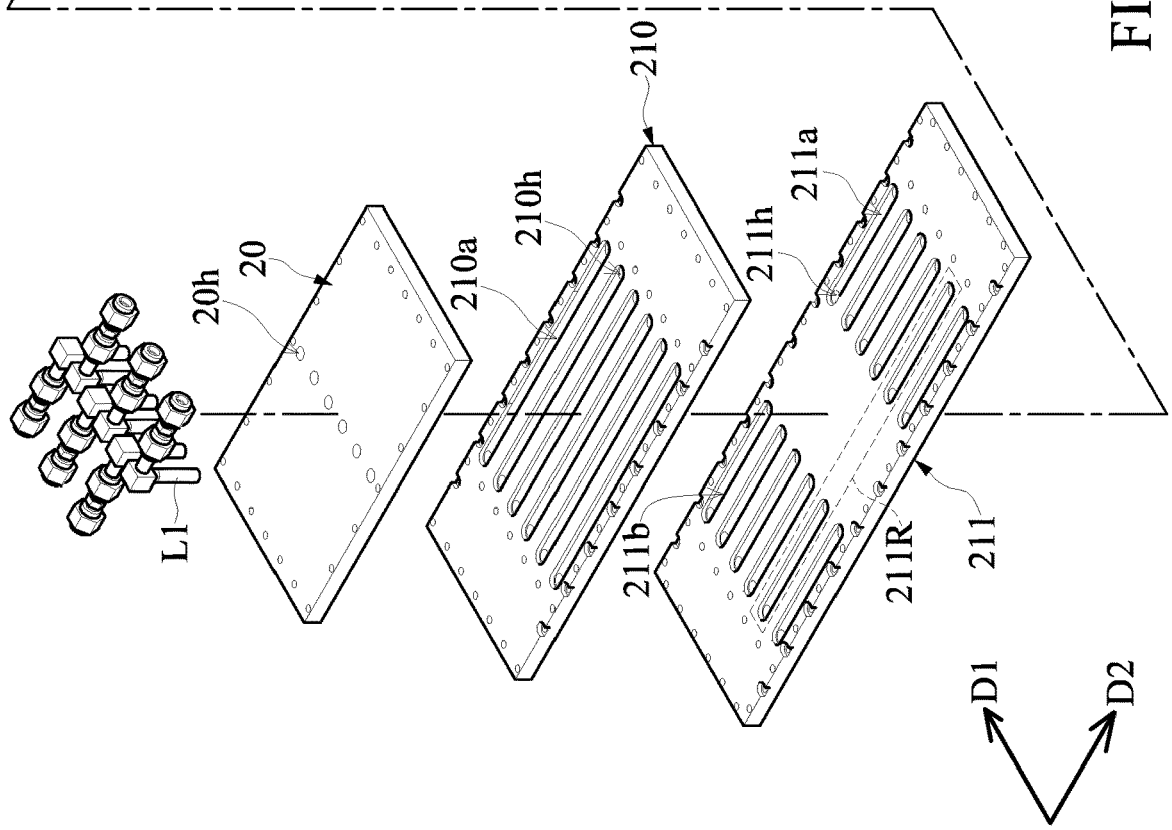
Figure 4:
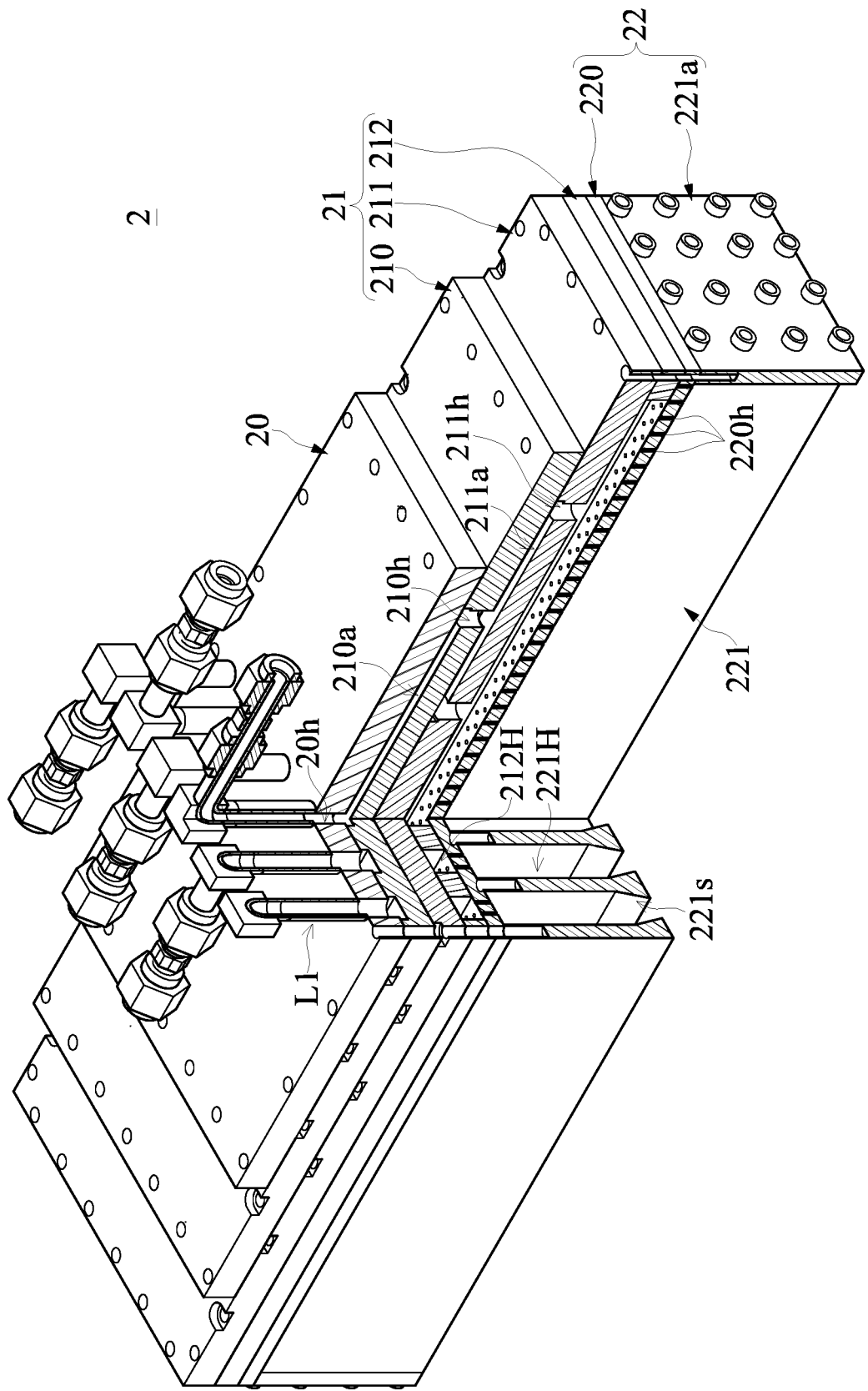
FIG. 4 is a schematic partial sectional view of the gas distribution module in FIG. 2.

Further, referring to FIGS. 2 to 4, FIG. 2 is a schematic three-dimensional view of the gas distribution module in an embodiment of the present disclosure; FIG. 3 is a perspective exploded view of the gas distribution module in FIG. 2; and FIG. 4 is a schematic partial sectional view of the gas distribution module in FIG. 2.

The gas distribution module 2 includes an inflow element 20, a guide assembly 21, and an outflow element 22. The inflow element 20 includes a plurality of inlet holes 20h individually arranged thereon. In this embodiment, the plurality of inlet holes 20h is arranged in a first direction D1.

The plurality of inlet holes 20h is respectively in spatial communication with a plurality of gas pipelines L1. In this embodiment, different gases, for example, two different precursor gases or precursor gases and a purge gas, may be supplied to the different gas pipelines L1, so as to be introduced respectively through the different inlet holes 20h. The plurality of inlet holes 20h may be respectively in communication with different gas storage units, so as to introduce the two different gases. That is, in the cyclical epitaxial deposition system M1 in the embodiment of the present disclosure, two different gases, for example, two different precursor gases and/or purge gases may be introduced to the deposition zone at the same time.

The guide assembly 21 is disposed beneath the inflow element 20, and includes a plurality of guide channels that are not in spatial communication with one another and a plurality of temporary gas retention trenches 212H respectively corresponding to the guide channels. Each guide channel of the guide assembly 21 includes a main channel 210a and a plurality of distribution channels 211a and 211b connected to the main channel 210a.

As shown in FIG. 3, the guide assembly 21 includes a guide plate 210, a distribution plate 211, and a gas retention plate 212. The distribution plate 211 is located between the guide plate 210 and the gas retention plate 212.

The guide plate 210 has the plurality of main channels 210a formed thereon. The main channels 210a are arranged in parallel in the first direction D1 and in fluid communication with the plurality of inlet holes 20h respectively. In addition, each main channel 210a extends in a second direction D2. In this embodiment, each main channel 210a is a groove provided on the guide plate 210. In addition, as shown in FIG. 3, each main channel 210a (a groove) has two through holes 210h running through the guide plate 210. Specifically speaking, the two through holes 210h are respectively located at two opposite ends of the main channel 210a (a groove).

The distribution plate 211 has a plurality of distribution regions 211R respectively corresponding to the main channels 210a. In addition, in this embodiment, at least two distribution channels 211a and 211b are located in each distribution region 211R. The two distribution channels 211a and 211b are bar-shaped grooves mutually separated from each other and arranged in the second direction D2. As shown in FIG. 3, each main channel 210a and the two distribution channels 211a and 211b in the corresponding distribution region 211R partially overlap in a vertical direction.

It should be noted that, a middle section of each main channel 210a does not overlap the two distribution channels 211a and 211b in the vertical direction, while the two opposite end sections of each main channel 210a overlap the two distribution channels 211a and 211b respectively. Since the through holes 210h of each main channel 210a are respectively located on its two opposite ends, a gas flowing to the main channel 210a may be guided to the two distribution channels 211a and 211b through the through holes 210h on the two opposite ends of the main channel 210a. Thus, the gas flowing to the main channel 210a may diffuse within a distribution range along the second direction D2.

In addition, as shown in FIG. 3, each of the distribution channels 211a and 211b has two via holes 211h penetrating through the distribution plate 211, and the two via holes 211h are respectively located on two opposite ends of the distribution channel 211a or 211b.

Referring to FIG. 3 again, the gas retention plate 212 has a plurality of temporary gas retention trenches 212H that are not in spatial communication with one another. In this embodiment, the temporary gas retention trenches 212H is arranged to respectively correspond to the distribution regions 211R. That is to say, these temporary gas retention trenches 212H are arranged in parallel in the first direction D1, and each temporary gas retention trench 212H extends along the second direction D2. In addition, in this embodiment, each temporary gas retention trench 212H extends from an upper surface of the gas retention plate 212 to its lower surface.

Each temporary gas retention trench 212H and the two distribution channels 211a and 211b in the corresponding distribution region 211R overlap in the vertical direction. In this way, each of the distribution channels 211a and 211b may be in fluid communication with the corresponding temporary gas retention trench 212H through the two via holes 211h. Based on the foregoing description, the corresponding ones of the temporary gas retention trenches 212H, the distribution channels 211a and 211b, and the main channels 210a overlap in the vertical direction. In this way, a gas introduced through the inlet holes 20h can flow along the guide channels (including the main channels 210a and the distribution channels 211a and 211b) to the temporary gas retention trenches 212H.

Referring to FIGS. 2 and 3 continuously, the outflow element 22 in this embodiment includes two lateral plates 221a and 221b arranged opposite to each other, a plurality of partition plates 221, and a diffusion plate 220.

The partition plates 221 are connected between the two lateral plates 221a and 221b. In this embodiment, each partition plate 221 extends in the same direction as each temporary gas retention trench 212H, that is, all of them extend in the second direction D2, so as to define a plurality of outlet channels 221H between the two lateral plates 221a and 221b.

The diffusion plate 220 is located between the partition plates 221 and the gas retention plate 212 of the guide assembly 21, and has a plurality of diffusion regions 220R. The diffusion regions 220R are arranged to respectively correspond to the temporary gas retention trenches 212H. The outlet channels 221H are arranged to respectively correspond to the diffusion regions 220R. That is to say, each diffusion region 220R and each partition plate 221 are staggered in the vertical direction.

As shown in FIGS. 3 and 4, each diffusion region 220R has a plurality of diffusion apertures 220h scatteringly arranged thereon, and each temporary gas retention trench 212H is in fluid communication with the corresponding outlet channel 221H through the diffusion apertures 220h in the corresponding diffusion region 220R. In this way, the gas entering the guide channels from the inlet holes 20h and flowing along the guide channels to the temporary gas retention trenches 212H can be dispersed and guided to a region to be processed on the substrate S1.

Referring to FIG. 1 again, it should be noted that, in this embodiment, the conveyance device 4 drives the substrate S1 to move along the first direction D1, and thus the substrate S1 has a width in the second direction D2.

Referring to FIG. 3 which is to be read in conjunction with FIG. 4, the diffusion apertures 220h in each diffusion region 220R are relatively tiny and dense. Therefore, after the gas flows to the temporary gas retention trenches 212H, a great portion of the gas is temporarily kept inside the temporary gas retention trenches 212H and diffuses along the second direction D2; afterwards, flows to the outlet channels 221H through the diffusion apertures 220h, and finally is guided to the substrate S1. That is to say, by providing the diffusion plate 220 above the outlet channels 221H, the diffusion time of the gas in the second direction D2 can be prolonged.

When the gas flows to the substrate S1 through the outlet channels 221H, uneven gas supply can be avoided. Thus, the gas distribution module 2 in the embodiment of the present disclosure can distribute the gas to the substrate S1 in a width direction (namely, the second direction D2), so that a uniform film layer can be formed on the region A1 to be processed on the substrate S1 in its width direction.

Referring to FIG. 4, in this embodiment, each outlet channel 221H has a tapered opening end portion 221s, so that the gas flowing out of the outlet channel 221H can rapidly reach to the surface of the substrate S1. In other words, each partition plate 221 has two bevels extending towards different directions respectively on its bottom ends of two opposite lateral sides. In this way, the tapered opening end portion 221s can be defined between bottom portions of two adjacent partition plates 221.

Figure 5:
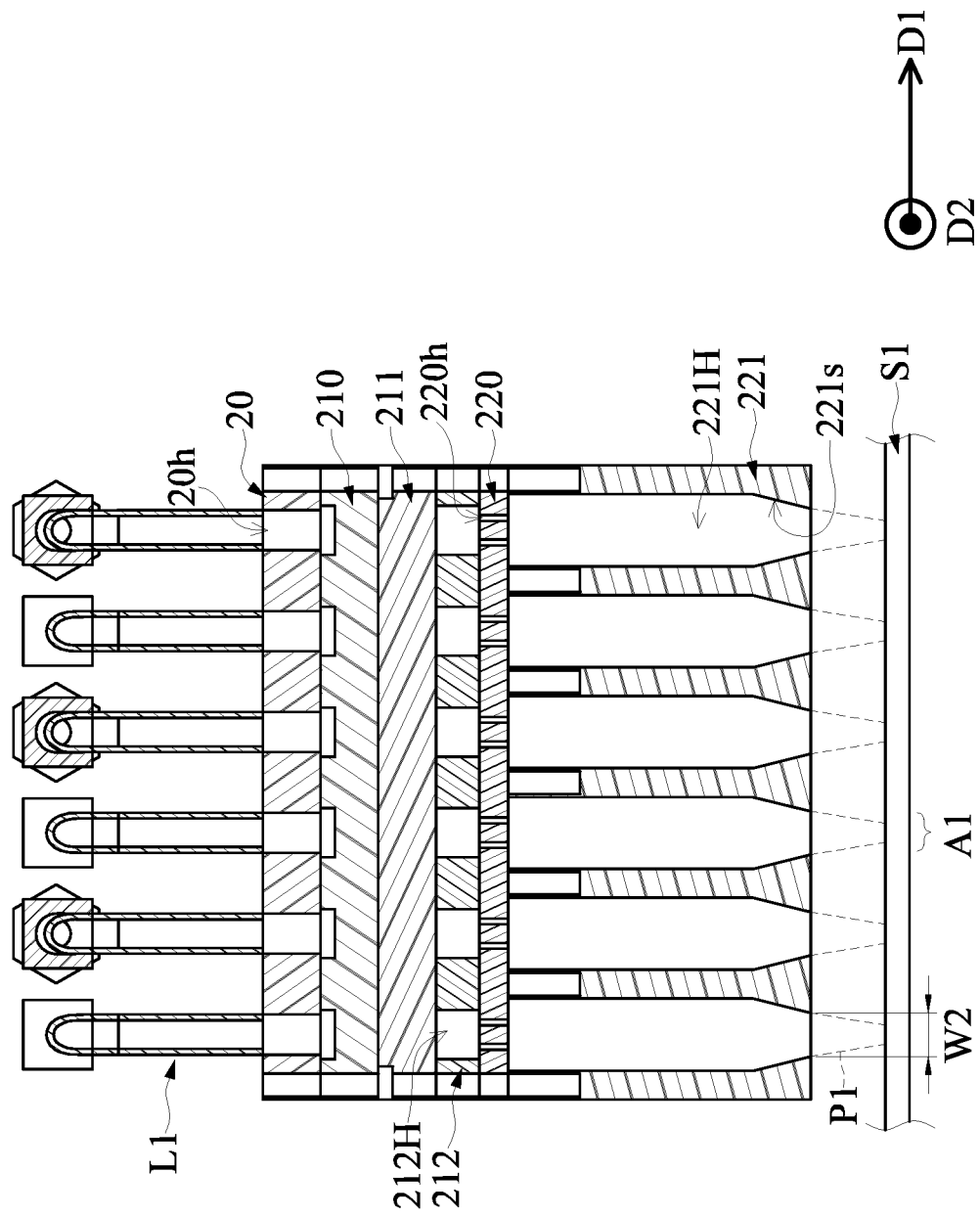
FIG. 5 is a schematic sectional view along a line V-V in FIG. 2.
Figure 6:
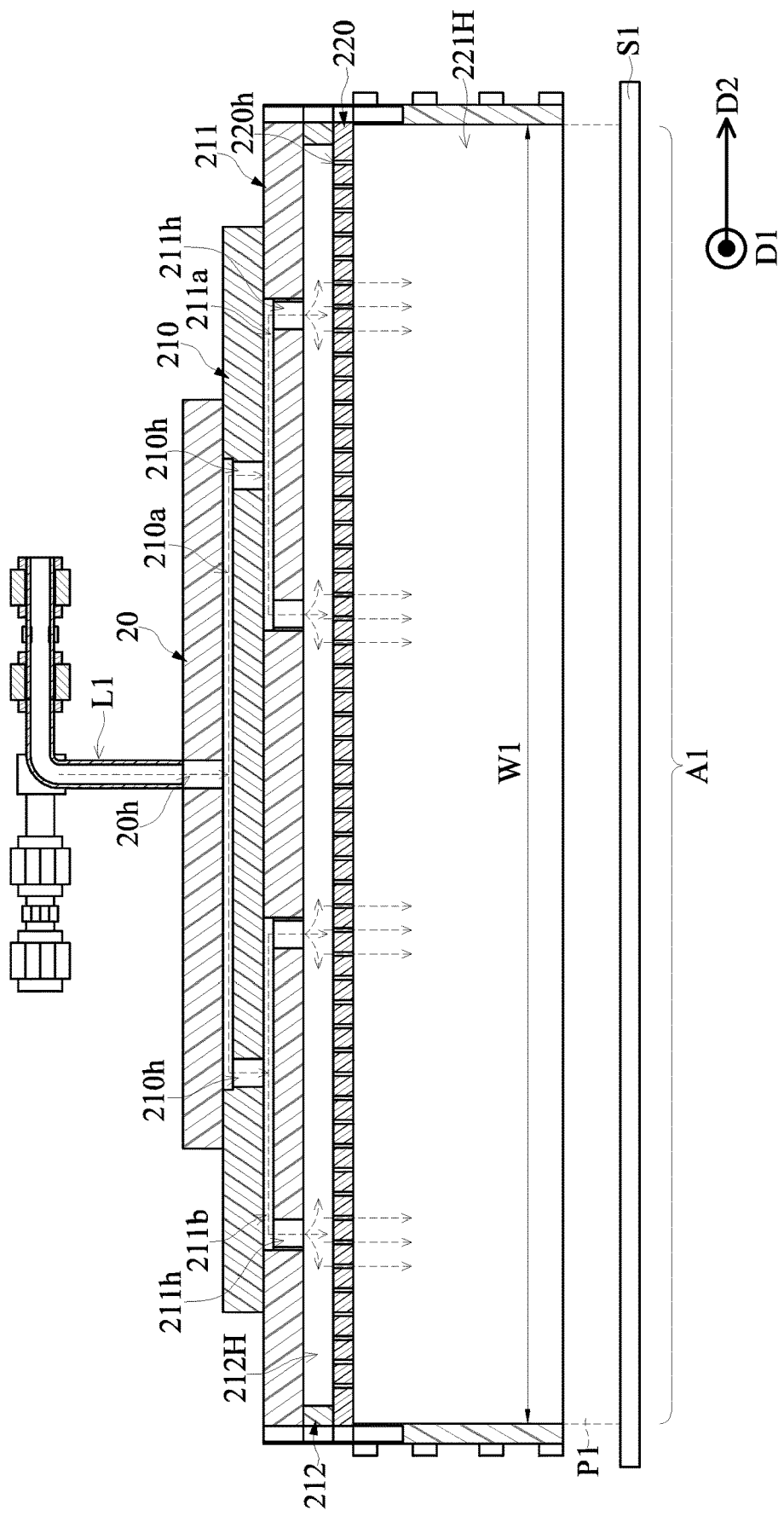
FIG. 6 is a schematic sectional view along a line VI-VI in FIG. 2.

Referring to FIGS. 5 and 6, in this embodiment, after being supplied from the gas pipelines L1 to the inlet holes 20h, the gas flows along the guide channels (including the main channels 210a and the distribution channels 211a and 211b) of the guide assembly 21 to the temporary gas retention trenches 212H. Afterwards, the gas which is kept inside the temporary gas retention trenches 212H enters the outlet channels 221H through the corresponding multiple diffusion apertures 220h, and is guided to the region A1 to be processed on the substrate S1.

Referring to FIG. 5, the gas passing through the corresponding outlet channel 221H forms a gas distribution region P1 above the substrate S1. Two gas distribution regions P1 above the substrate S1 that are respectively formed by different gases passing through two adjacent outlet channels 221H do not overlap. In this way, when the two adjacent outlet channels 221H supply different gases, the two different gases can be prevented from mutual diffusion and intermixture before being guided to the substrate S1.

Each outlet channel 221H has an opening (not marked with a number). In an embodiment, the shortest vertical distance from the end of the opening of each outlet channel 221H to the surface of the substrate S1 ranges from 0.1 cm to 2.0 cm, thus preventing the gas from diffusing in a horizontal direction before being sprayed onto the substrate S1. In addition, as shown in FIG. 6, a length W1 of the opening in the width direction (namely, the second direction D2) of the substrate S1 is greater than or equal to a width of the region A1 to be processed on the substrate S1. In addition, a width W2 of the opening in the first direction D1 is about 0.5 cm to 1 cm, and an interval between two adjacent openings is at least greater than 0.5 cm, thus preventing interdiffusion of the gases out of adjacent openings before being guided to the substrate S1.

Based on the foregoing description, when the gas distribution module 2 in the embodiment of the present disclosure is applied in the cyclical epitaxial deposition system M1, different precursor gases and/or purge gases can be supplied through different gas pipelines L1, so that the different precursor gases and/or purge gases can be supplied to different regions on the substrate S1 respectively through different outlet channels 221H at the same time.

For example, if it is required to form a titanium nitride layer on the substrate S1, titanium tetrachloride ($TiCl_4$) and ammonia gas ($NH_3$) are used as the precursor gases; and an inert gas, for example, argon gas (Ar), is used as the purge gas. The three different gases may be supplied onto the substrate S1 respectively through different outlet channels 221H according to a sequence of each deposition cycle.

In this way, when the substrate S1 is continuously conveyed, a region A1 to be processed on the substrate S1 sequentially passes below an outlet channel 221H for supplying the titanium tetrachloride, an outlet channel 221H for supplying the argon gas, and an outlet channel 221H for supplying the ammonia gas, to complete one deposition cycle and form a single monomolecular layer on the region A1 to be processed. Thus, after the substrate S1 is driven to move the region A1 to be processed to pass below multiple gas distribution modules 2, multiple monomolecular layers can be formed on the region A1 to be processed.

That is to say, the cyclical epitaxial deposition system M1 in the embodiment of the present disclosure basically still uses the principle of atomic layer deposition, to form a film layer on the substrate S1. However, differences from a conventional atomic layer deposition apparatus lie in that, in the cyclical epitaxial deposition system M1 in the embodiment of the present disclosure, the conveyance device 4 is used to drive the substrate S1 to move, and the gas distribution module 2 is further used to simultaneously introduce precursor gases required in each deposition cycle to different regions on the substrate S1.

Referring to FIG. 1 again, the cyclical epitaxial deposition system M1 in the embodiment of the present disclosure further includes a heating module (not marked with a number) which is disposed in the deposition zone and located below the conveyance path, so as to heat the substrate S1 to a specific reaction temperature.

Referring to FIG. 1, the cyclical epitaxial deposition system M1 in the embodiment of the present disclosure further includes a cooling device 5 disposed at the conveyance path. Accordingly, the substrate S1 conveyed out of the deposition zone can be guided to the cooling device 5. In this embodiment, the cooling device 5 is a roller equipped with a cooling pipeline. After being conveyed from the deposition zone to the cooling device 5 and cooled, the substrate S1 is rolled up by the second feeding and receiving module 42. However, the present disclosure is not limited thereto, and the cooling device 5 may also be omitted in other embodiments.

Advantageous Effects of the Embodiments

The present disclosure achieves the following advantageous effects. In the cyclical epitaxial deposition system and the gas distribution module thereof provided by the present disclosure, a guide assembly 21 includes a plurality of guide channels that are not in spatial communication with one another and a plurality of temporary gas retention trenches 212H respectively corresponding to the guide channels, and an outflow element 22 has a plurality of diffusion regions 220R respectively corresponding to the temporary gas retention trenches 212H and a plurality of outlet channels 221H respectively corresponding to the diffusion regions 220R, so that a gas flowing along the guide channels (including the main channels 210a and the distribution channels 211a and 211b) to the temporary gas retention trenches 212H is dispersed and guided to a region A1 to be processed on the substrate S1.

In this way, when the gas distribution module 2 is applied in the cyclical epitaxial deposition system M1, different precursor gases and/or at least one purge gas can be guided to different regions to be processed on the substrate S1 at the same time, and a film layer can be continuously formed on the substrate S1. A conveyance device 4 is further used to continuously convey the substrate S1 to pass below the gas distribution module 2, thus shortening deposition time. Therefore, the present disclosure is applicable to manufacturing elements or devices requiring mass production.

Moreover, in the gas distribution module 2 of the embodiment in the present disclosure, by the arrangements of a guide plate, a distribution plate 211, a temporary gas retention plate 212, and a diffusion plate 220, the gas introduced through the inlet holes 20h can be distributed to the substrate S1 in its width direction (namely, a second direction D2), so that a uniform film layer can be formed on the region A1 to be processed on the substrate S1 in its width direction.

The above disclosed content merely describes preferred and feasible embodiments of the present disclosure, and is not intended to limit the scope of patent application of the present disclosure. Therefore, any equivalent technical changes made according to the description and content of the drawings of the present disclosure all fall within the scope of the patent application of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A gas distribution module, comprising:
an inflow element, provided with a plurality of inlet holes individually arranged thereon;
a guide assembly, comprising a plurality of guide channels that are not in fluid communication with one another and a plurality of gas retention trenches respectively corresponding to the guide channels, wherein each of the guide channels includes a main channel and a plurality of distribution channels connected to the main channel, the main channel is in fluid communication with the corresponding inlet hole, and each of the distribution channels is in fluid communication with the corresponding one of the gas retention trenches; and
an outflow element, wherein the guide assembly is provided between the inflow element and the outflow element; and the outflow element includes:
two lateral plates arranged opposite to each other;
a plurality of partition plates connected between the two lateral plates, wherein each of the partition plates extends in substantially the same direction as each of the gas retention trenches, wherein a plurality of outlet channels are defined between the two lateral plates; and
a diffusion plate disposed between the plurality of partition plates and the guide assembly, and has a plurality of diffusion regions, wherein each of the diffusion regions and each of the partition plates are staggered in a vertical direction, and the plurality of diffusion regions respectively corresponding to the gas retention trenches, and the plurality of outlet channels arranged to respectively correspond to the plurality of diffusion regions;
wherein each of the diffusion regions has a plurality of diffusion apertures scatteringly arranged thereon, and each gas retention trench is in fluid communication with the corresponding outlet channel through the plurality of diffusion apertures in the corresponding diffusion region, so that a gas flowing along the guide channels to the gas retention trenches is dispersed and guided to a region to be processed on a substrate.

2. The gas distribution module of claim 1, wherein each of the outlet channels has a tapered opening end portion.

3. The gas distribution module of claim 1, wherein each of the outlet channels has an opening, and a length of the opening in a width direction of the substrate is greater than a width of the region to be processed on the substrate.

4. The gas distribution module of claim 1, wherein the guide assembly includes:
a guide plate having the main channels;
a distribution plate having a plurality of distribution regions respectively corresponding to the main channels, wherein at least two of the distribution channels are located in each distribution region and are mutually separated from each other; and
a gas retention plate having the gas retention trenches that are not in fluid communication with one another, wherein the distribution plate is located between the guide plate and the gas retention plate;
wherein one of the gas retention trenches, one of the distribution channels, and one of the main channels that correspond to one another overlap in a vertical direction.

5. The gas distribution module of claim 4, wherein each of the main channels is a groove and has two through holes penetrating through the guide plate, the two through holes are respectively located on two opposite ends of each of the main channels, and each of the main channels is in fluid communication with the at least two distribution channels in the corresponding distribution region via the two through holes.

6. The gas distribution module of claim 4, wherein each of the distribution channels is a bar-shaped groove and has two via holes running through the distribution plate, the two via holes are respectively located at two opposite ends of each of the distribution channels, and each of the distribution channels is in fluid communication with the corresponding gas retention trench through the two via holes.

7. The gas distribution module of claim 4, wherein each gas retention trench extends from an upper surface to a lower surface of the gas retention plate.

8. The gas distribution module of claim 1, wherein two gases respectively pass through two adjacent ones of the outlet channels to form two gas distribution regions above the substrate; and the two gas distribution regions above the substrate do not overlap.

9. A cyclical epitaxial deposition system, comprising:
a deposition chamber;
a conveyance device, used to continuously convey a substrate into or out of a deposition chamber along a conveyance path; and
a gas distribution, disposed in the deposition chamber and located above the conveyance path, so as to separately guide at least one precursor gas and at least one purge gas to the substrate, wherein the gas distribution module includes:
an inflow element, provided with a plurality of inlet holes individually arranged thereon;
a guide assembly, including a plurality of guide channels that are not in fluid communication with one another and a plurality of gas retention trenches respectively corresponding to the guide channels, wherein each of the guide channels includes a main channel and a plurality of distribution channels connected to the main channel, the main channel is in fluid communication with the corresponding inlet hole, and each of the distribution channels is in fluid communication with the corresponding gas retention trench; and
an outflow element, wherein the guide assembly is provided between the inflow element and the outflow element; and the outflow element has a plurality of diffusion regions respectively corresponding to the gas retention trenches, and a plurality of outlet channels arranged to respectively correspond to the plurality of diffusion regions;
wherein each of the diffusion regions has a plurality of diffusion apertures scatteringly arranged thereon, and each gas retention trench is in fluid communication with the corresponding outlet channel through the plurality of diffusion apertures in the corresponding diffusion region, so that a gas flowing along the guide channels to the gas retention trenches is dispersed and guided to a region to be processed on a substrate.

10. A gas distribution module, comprising:
an inflow element, provided with a plurality of inlet holes individually arranged thereon;
a guide assembly including a plurality of guide channels that are not in fluid communication with one another and a plurality of gas retention trenches respectively corresponding to the guide channels, wherein each of the guide channels includes a main channel and a plurality of distribution channels connected to the main channel, the main channel is in fluid communication with the corresponding inlet hole, and each of the distribution channels is in fluid communication with the corresponding gas retention trench; and
an outflow element, wherein the guide assembly is provided between the inflow element and the outflow element; and the outflow element has a plurality of diffusion regions respectively corresponding to the gas retention trenches, and a plurality of outlet channels arranged to respectively correspond to the plurality of diffusion regions;
wherein each of the diffusion regions has a plurality of diffusion apertures scatteringly arranged thereon, and each gas retention trench is in fluid communication with the corresponding outlet channel through the plurality of diffusion apertures in the corresponding diffusion region, so that a gas flowing along the guide channels to the gas retention trenches is dispersed and guided to a region to be processed on a substrate;
wherein the guide assembly includes:
a guide plate having the main channels;
a distribution plate having a plurality of distribution regions respectively corresponding to the main channels, wherein at least two of the distribution channels are located in each distribution region and are mutually separated from each other; and
a gas retention plate having the gas retention trenches that are not in fluid communication with one another, wherein the distribution plate is located between the guide plate and the gas retention plate;
wherein one of the gas retention trenches, one of the distribution channels, and one of the main channels that correspond to one another overlap in a vertical direction.

11. The gas distribution module of claim 10, wherein each of the main channels is a groove and has two through holes penetrating through the guide plate, the two through holes are respectively located on two opposite ends of each of the main channels, and each of the main channels is in fluid communication with the at least two distribution channels in the corresponding distribution region via the two through holes.

12. The gas distribution module of claim 10, wherein each of the distribution channels is a bar-shaped groove and has two via holes running through the distribution plate, the two via holes are respectively located at two opposite ends of each of the distribution channels, and each of the distribution channels is in fluid communication with the corresponding gas retention trench through the two via holes.

13. The gas distribution module of claim 10, wherein each gas retention trench extends from an upper surface to a lower surface of the gas retention plate.

* * * * *